(12) United States Patent
Aritome

(10) Patent No.: US 7,742,335 B2
(45) Date of Patent: Jun. 22, 2010

(54) NON-VOLATILE MULTILEVEL MEMORY CELLS

(75) Inventor: Seiichi Aritome, Zhudong (TW)

(73) Assignee: Micron Technology, Inc., Boise, ID (US)

( * ) Notice: Subject to any disclaimer, the term of this patent is extended or adjusted under 35 U.S.C. 154(b) by 264 days.

(21) Appl. No.: 11/931,912

(22) Filed: Oct. 31, 2007

(65) Prior Publication Data

US 2009/0109745 A1 Apr. 30, 2009

(51) Int. Cl.
*G11C 16/04* (2006.01)
(52) U.S. Cl. .............................. 365/185.03; 365/185.18; 365/185.17
(58) Field of Classification Search ............ 365/185.03, 365/185.18, 185.17
See application file for complete search history.

(56) References Cited

U.S. PATENT DOCUMENTS

| | | | |
|---|---|---|---|
| 5,768,188 A | 6/1998 | Park et al. | |
| 5,872,735 A | 2/1999 | Banks | |
| 6,587,372 B2 | 7/2003 | Blodgett | |
| 6,807,610 B2 | 10/2004 | Frayer | |
| 7,164,601 B2 | 1/2007 | Mitani et al. | |
| 7,457,155 B2 * | 11/2008 | Nazarian | ............... 365/185.02 |
| 7,518,914 B2 | 4/2009 | Han | |
| 2006/0028877 A1 | 2/2006 | Meir | |

OTHER PUBLICATIONS

Cho, Myoung Kwan. "International Search Report" from related PCT Application, mailed Feb. 12, 2009, 3 pgs.

* cited by examiner

*Primary Examiner*—Huan Hoang
(74) *Attorney, Agent, or Firm*—Brooks, Cameron & Huebsch, PLLC

(57) ABSTRACT

The present disclosure includes methods, devices, modules, and systems for operating non-volatile multilevel memory cells. One method embodiment includes assigning, to a first cell coupled to a row select line, a first number of program states to which the first cell can be programmed. The method includes assigning, to a second cell coupled to the row select line, a second number of program states to which the second cell can be programmed, wherein the second number of program states is greater than the first number of program states. The method includes programming the first cell to one of the first number of program states prior to programming the second cell to one of the second number of program states.

21 Claims, 4 Drawing Sheets

NON-VOLATILE MULTILEVEL MEMORY CELLS

TECHNICAL FIELD

The present disclosure relates generally to semiconductor devices and, more particularly, to memory devices having non-volatile multilevel memory cells.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory, among others.

Flash memory devices are utilized as non-volatile memory for a wide range of electronic applications. Flash memory devices typically use a one-transistor memory cell that allows for high memory densities, high reliability, and low power consumption.

Uses for flash memory include memory for personal computers, personal digital assistants (PDAs), digital cameras, and cellular telephones. Program code and system data, such as a basic input/output system (BIOS), are typically stored in flash memory devices. This information can be used in personal computer systems, among others.

Two common types of flash memory array architectures are the "NAND" and "NOR" architectures, so called for the logical form in which the basic memory cell configuration of each is arranged.

A NAND array architecture arranges its array of floating gate memory cells in a matrix such that the gates of each floating gate memory cell of the array are coupled by rows to row select lines, e.g., word lines. However each memory cell is not directly coupled to a column sense line, e.g., bit line, by its drain. Instead, the memory cells of the array are coupled together in series, source to drain, between a source line and a column sense line.

Memory cells in a NAND array architecture can be configured, e.g., programmed, to a desired state. That is, electric charge can be placed on or removed from the floating gate of a memory cell to put the cell into a number of stored states. For example, a single level cell (SLC) can represent two binary states, e.g., 1 or 0. Flash memory cells can also store more than two digits, e.g., multiple binary states such as 1111, 0111, 0011, 1011, 1001, 0001, 0101, 1101, 1100, 0100, 0000, 1000, 1010, 0010, 0110, and 1110. Such cells may be referred to as multi state memory cells, multibit cells, or multilevel cells (MLCs). MLCs can allow the manufacture of higher density memories without increasing the number of memory cells since each cell can represent more than one bit. MLCs can have more than one programmed state, e.g., a cell capable of representing four bits can have fifteen programmed states and an erased state.

As NAND flash memory is scaled, parasitic capacitance coupling between adjacent memory cell floating gates becomes a problem. Floating gate-to-floating gate (FG-FG) interference can cause a wider Vt distribution when the distribution should be tighter. The wider distributions can result in a degraded programming performance as well as other problems.

These problems for single level cell (SLC) NAND arrays are even greater in a multiple level cell (MLC) NAND array. MLC memory stores multiple bits on each cell by using different threshold levels for each state that is stored. The difference between adjacent threshold voltage distributions may be very small as compared to an SLC memory device. Therefore, the effects of floating gate-to-floating gate coupling in an MLC device are greatly increased.

DETAILED DESCRIPTION

Embodiments of the present disclosure provide methods, devices, and systems for operating non-volatile multilevel memory cells. One method embodiment includes assigning, to a first cell coupled to a row select line, a first number of program states to which the first cell can be programmed. The method includes assigning, to a second cell coupled to the row select line, a second number of program states to which the second cell can be programmed, wherein the second number of program states is greater than the first number of program states. The method includes programming the first cell to one of the first number of program states prior to programming the second cell to one of the second number of program states.

In some embodiments, a third cell coupled to the row select line is assigned a third number of program states to which the third cell can be programmed. In such embodiments, the third number of program states is greater than the second number of program states and the third cell is programmed after the first and second cell. The number of program states assigned to the number of cells and/or the bit assignments of the cells can be based on a programming sequence associated with the number of cells.

In the following detailed description of the present disclosure, reference is made to the accompanying drawings that form a part hereof, and in which is shown by way of illustration how various embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

Figure 1:
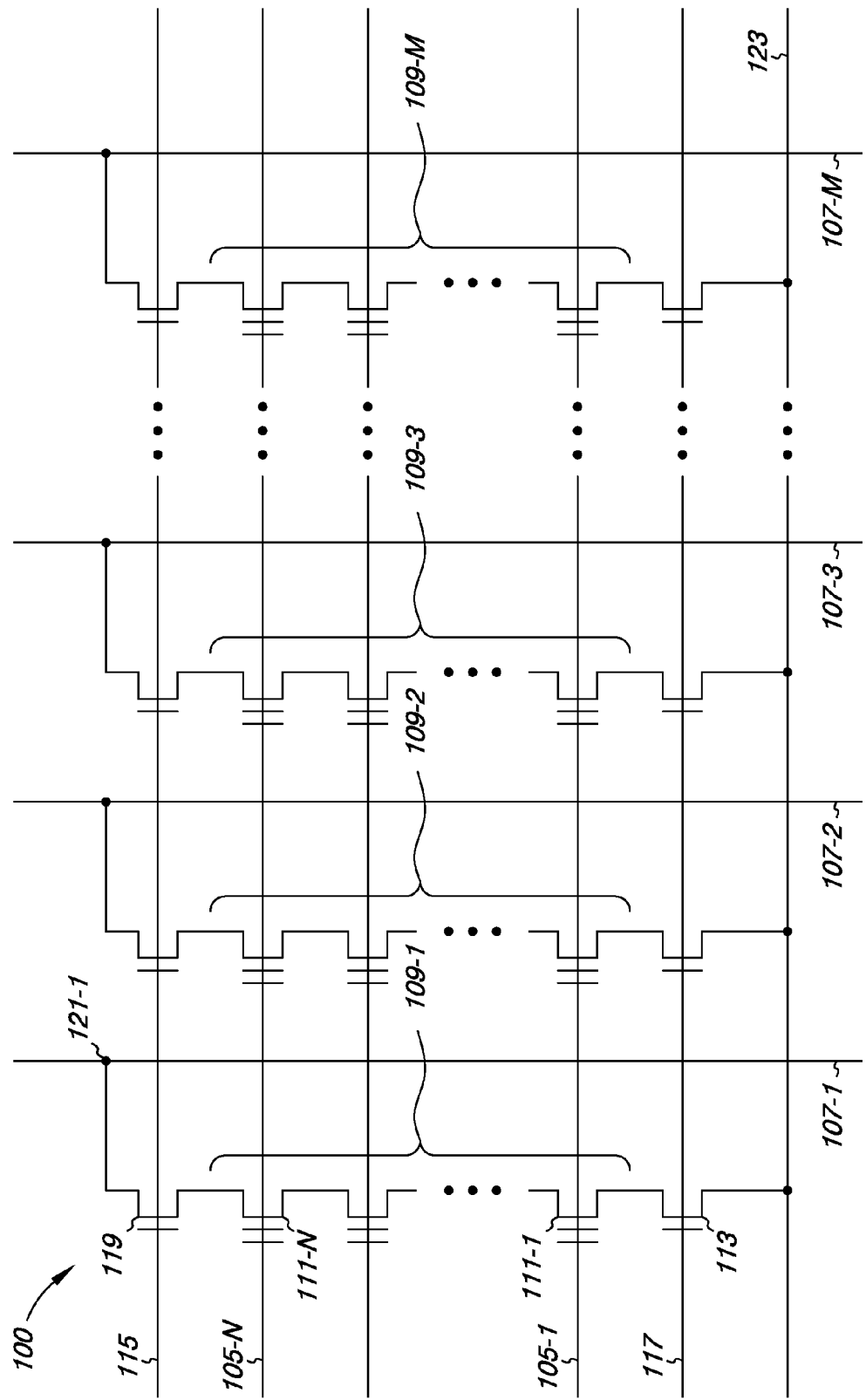
FIG. 1 is a schematic of a portion of a non-volatile memory array that can be used with embodiments of the present disclosure.

FIG. 1 is a schematic of a portion of a non-volatile memory array 100 that can be used with embodiments of the present disclosure. The embodiment of FIG. 1 illustrates a NAND architecture non-volatile memory. However, embodiments described herein are not limited to this example. As shown in FIG. 1, the memory array 100 includes row select lines 105-1, . . . , 105-N and intersecting column sense lines 107-1, . . . , 107-M. Row select lines may be referred to herein as "word lines" and column sense lines may be referred to herein as "bit lines." For ease of addressing in the digital environment, the number of word lines 105-1, . . . , 105-N and the number of bit lines 107-1, . . . , 107-M are each some power of two, e.g., 256 word lines by 4,096 bit lines.

Memory array 100 includes NAND strings 109-1, . . . , 109-M. Each NAND string includes non-volatile memory cells 111-1, . . . , 111-N, each located at an intersection of a word line 105-1, . . . , 105-N and a local bit line 107-1, . . . , 107-M. The non-volatile memory cells 111-1, . . . , 111-N of each NAND string 109-1, . . . , 109-M are connected in series source to drain between a source select gate (SGS), e.g., a field-effect transistor (FET) 113, and a drain select gate (SGD), e.g., FET 119. Source select gate 113 is located at the intersection of a local bit line 107-1 and a source select line 117 while drain select gate 119 is located at the intersection of a local bit line 107-1 and a drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to the local bit line 107-1 for the corresponding NAND string 109-1 at drain contact 121-1. The source of drain select gate 119 is connected to the drain of the last memory cell 111-N, e.g., floating-gate transistor, of the corresponding NAND string 109-1.

In various embodiments, construction of non-volatile memory cells, 111-1, . . . , 111-N, includes a source, a drain, a floating gate or charge storage layer, and a control gate. Non-volatile memory cells, 111-1, . . . , 111-N, have their control gates coupled to a word line, 105-1, . . . , 105-N respectively. A column of the non-volatile memory cells, 111-1, . . . , 111-N, make up the NAND strings, e.g., 109-1, . . . , 109-M, coupled to a given local bit line, e.g., 107-1, . . . , 107-M respectively. A row of the non-volatile memory cells are commonly coupled to a given word line, e.g., 105-1, . . . , 105-N. An AND array architecture would be similarly laid out except that the string of memory cells would be coupled in parallel between the select gates.

As one of ordinary skill in the art will appreciate, subsets of cells coupled to a selected word line, e.g., 105-1, . . . , 105-N, can be programmed and/or read together as a group. A programming operation, e.g., a write operation, can include applying a number of program pulses, e.g., 16V-20V, to a selected word line in order to increase the threshold voltage (Vt) of selected cells to a desired program voltage level corresponding to a desired program state. A read/sensing operation, can include sensing a voltage and/or current change of a bit line coupled to a selected cell in order to determine the state of the selected cell. The read and/or program verify operation can include applying a read voltage, e.g., 0V-5V, to a selected word line, while biasing the unselected cells of the string at a voltage, e.g., 5.5V, sufficient to place the unselected cells in a conducting state independent of the threshold voltage of the unselected cells. The bit line corresponding to the selected cell being read/verified can be sensed to determine whether or not the selected cell conducts in response to the particular read voltage applied to the selected word line.

In various instances, the bit lines 107-1, . . . , 107-M can be separated into even numbered bit lines and odd numbered bit lines. In such cases, and as described further in connection with FIGS. 2 and 3 below, cells corresponding to a selected word line and even numbered bit lines can be programmed together and referred to as an even logical page of data. Similarly, cells corresponding to the selected word line and odd numbered bit lines can be programmed together and referred to as an odd logical page of data. The cells coupled to alternating even numbered and odd numbered bit lines, e.g., an even page and an odd page, can be programmed and/or read at different times. For instance, even pages associated with selected word lines can be programmed and/or read before the odd pages associated with the selected word lines.

As one of ordinary skill in the art will appreciate, dividing word lines 105-1, . . . , 105-N, e.g., physical rows, into a number of logical pages that are programmed and/or read at separate times can provide shielding among adjacent bit lines, e.g., an adjacent even and odd bit line, which can reduce bit line coupling associated with read and/or program verify operations. Adjacent bit line coupling can produce voltage noise on bit lines which can lead to inaccurate read and/or verify operations.

However, programming adjacent memory cells at different times can lead to undesirable Vt shifts due to FG-FG interference effects. For instance, the Vt level of prior programmed cells, e.g., cells coupled to even bit lines, can be shifted from their desired programmed levels due to Vt increases of subsequently programmed adjacent cells, e.g., cells coupled to odd bit lines. The Vt level shifts of programmed cells due to FG-FG interference can lead to erroneous data reads. The undesirable FG-FG interference increases due to memory device scaling. That is, the FG-FG interference effects increase as the physical proximity of adjacent cells, e.g., adjacent floating gates, decreases.

As described in connection with FIGS. 2 and 3, various embodiments of the present disclosure can compensate for FG-FG interference effects associated with alternately programmed and/or read cells corresponding to even and odd logical pages by varying the number of program states assigned to the even and odd bit line cells. The number of assigned programmed states, e.g., the number of different Vt levels to which a given cell can be programmed, corresponds to a bit assignment for the memory cell. In some embodiments, the bit assignment is a non-integer bit assignment. That is, a particular cell can be assigned a bit value which represents a non-integer number of bits, e.g., 1.5 bits, 2.5 bits, 3.5 bits, 4.5 bits, etc.

In various embodiments, the number of program states assigned to different cells, e.g., the number of binary bits storable by different cells, is based on a particular programming sequence. That is, in various embodiments, subsets of cells coupled to a selected word line are assigned different numbers of program states depending on the order in which the subsets are programmed. In such embodiments, subsets of cells programmed prior in time have a lesser number of assigned program states than subsets of cells programmed later in time. Assigning a lesser number of program states to subsets programmed prior in time and a greater number of program states to subsets programmed later in time can maintain or increase storage capacity associated with an array of non-volatile multilevel memory cells, e.g., array 100 shown in FIG. 1, while reducing adverse FG-FG interference effects associated with adjacent cells, e.g., adjacent cells coupled to an even and an odd bit line.

Figure 2:
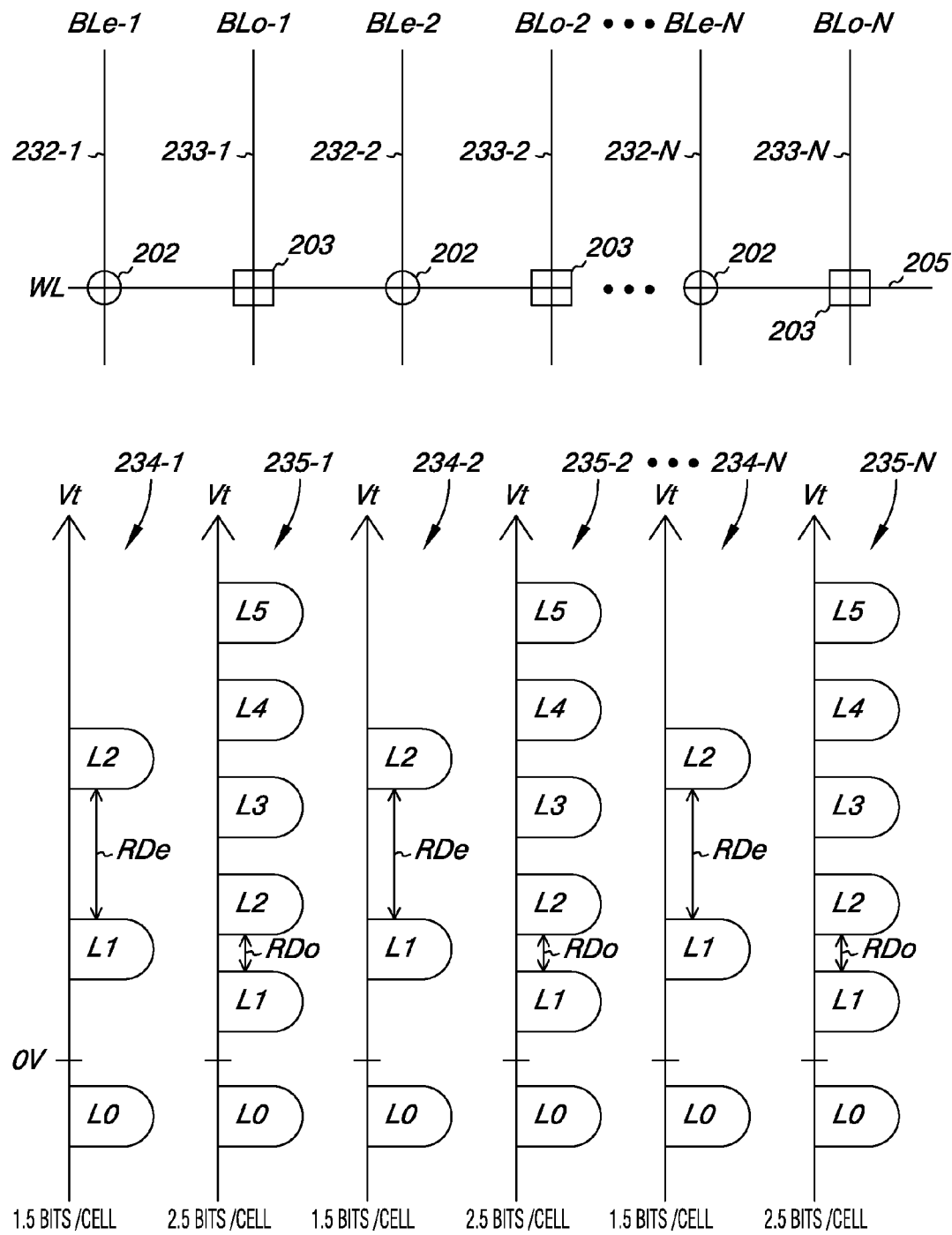
FIG. 2 illustrates threshold voltage distribution images associated with cells having different bit assignments in accordance with an embodiment of the present disclosure.

FIG. 2 illustrates threshold voltage distribution images associated with cells having different bit assignments in accordance with an embodiment of the present disclosure. The embodiment shown in FIG. 2 illustrates a number of cells 202/203 coupled to a word line (WL) 205. As shown in FIG. 2, the cells 202 are coupled to even numbered bit lines 232-1 (BLe-1), 232-2 (BLe-2), . . . , 232-N (BLe-N) and the cells 203 are coupled to odd numbered bit lines 233-1 (BLo-1), 233-2 (BLo-2), . . . , 233-N (BLo-N). That is, the cells 202 are interwoven with the cells 203 on alternating bit lines along word line 205. As the reader will appreciate, the bit lines can be coupled to sensing circuitry (not shown) that can be used to determine the Vt level of cells 202/203 during operation. Although only one word line 205 is illustrated in the embodiment of FIG. 2, embodiments can include any number of word lines, e.g., word lines 105-1 to 105-N shown in FIG. 1.

In the embodiment of FIG. 2, the even bit line cells 202 are programmed and read together as a group and correspond to an even page associated with word line 205. Similarly, the odd bit line cells 203 are programmed and read together as a group and correspond to an odd page associated with word line 205. That is, program operations, verify operations, and/or read operations can be performed on the even bit line cells 202 as a group and can be performed on the odd bit line cells 203 as a group.

The embodiment of FIG. 2 illustrates a number of threshold voltage (Vt) distribution images 234-1, 234-2, ..., 234-N which correspond to cells 202 coupled to respective even bit lines 232-1, 232-2, ..., 232-N. The Vt distribution images 235-1, 235-2, ..., 235-N correspond to cells 203 coupled to respective odd bit lines 233-1, 233-2, ..., 233-N. The even bit line Vt distribution images 234-1, 234-2, ..., 234-N correspond to cells 202 having three assigned program states, e.g., Vt distributions L0, L1, and L2 as shown. The odd bit line Vt distribution images 235-1, 235-2, ..., 235-N correspond to odd bit line cells 203 having six assigned program states, e.g., Vt distributions L0, L1, L2, L3, L4, and L5 as shown. That is, the even bit line cells 202 can be programmed such that the Vt of the cell 202 is within one of the three assigned Vt distributions L0, L1, and L2 associated with the distribution images 234-1, 234-2, ..., 234-N. Similarly, the odd bit line cells 203 can be programmed such that the Vt of the cell 203 is within one of the six assigned Vt distributions L0, L1, L2, L3, L4, and L5 associated with the distribution images 235-1, 235-2, ..., 235-N. As the reader will appreciate, the L0 state can be referred to as an erase state or as a lowermost program state. In operation, memory cells 202 and 203 can be placed in the L0 erase state prior to being programmed to one of their respective assigned states via a write operation.

During operation, the even bit line cells 202 are programmed prior to the interwoven odd bit line cells 203 coupled to a selected word line 205. That is, during a write operation, the cells 202 coupled to even bit lines 232-1, 232-2, ..., 232-N are programmed to one of the three program states shown in respective Vt distribution images 234-1, 234-2, ..., 234-N and then the cells 203 coupled to odd bit lines 233-1, 233-2, ..., 233-N are subsequently programmed to one of the six program states shown in respective Vt distribution images 235-1, 235-2, ..., 235-N.

As shown in FIG. 2, the Vt distribution images 234-1, 234-2, ..., 234-N correspond to cells 202 representing 1.5 bits/cell and the Vt distribution images 235-1, 235-2, ..., 235-N correspond to cells 203 representing 2.5 bits/cell. That is, the assigned number of states to which a given memory cell 202/203 can be programmed corresponds to an assigned number of binary bits storable by the given cell. In the embodiment shown in FIG. 2, each of the cells 202 and 203 have a non-integer bit assignment. For instance, the even bit line cells 202 are 1.5 bit cells, e.g., the three assigned program states associated with the cells 202 can represent 1.5 binary bits of stored data. The odd bit line cells 203 are 2.5 bit cells, e.g., the six assigned program states associated with the cells 203 can represent 2.5 binary bits of stored data. Embodiments are not limited to the example shown in FIG. 2.

For instance, the even and odd bit line cells can have various different program state assignments and corresponding different bit assignments. In some embodiments, the even bit line cells 202 are programmable to six states, e.g., the cells 202 are 2.5 bit cells, and the odd bit line cells 203 are programmable to 12 states, e.g., the cells 203 are 3.5 bit cells. In some embodiments, the even bit line cells 202 are programmable to three states, e.g., the cells 202 are 1.5 bit cells, and the odd bit line cells 203 are programmable to 24 states, e.g., the cells 203 are 4.5 bit cells. Embodiments of the present disclosure are not limited to memory cells having non-integer bit assignments. For instance, in some embodiments, the even and/or odd bit line cells can be 2 bit, 3 bit, 4 bit, or 5 bit cells programmable to 4 states, 8 states, 16 states, or 32 states, respectively.

The embodiment illustrated in FIG. 2 includes read margins associated with the even 202 and odd 203 bit line cells. As shown in Vt distribution images 234-1, 234-2, ..., 234-N, the even bit line cells 202 include an associated read margin RDe between adjacent program states L1 and L2. As shown in Vt distribution images 235-1, 235-2, ..., 235-N, the odd bit line cells 203 include an associated read margin RDo between adjacent program states L1 and L2. Read margin RDe is greater than read margin RDo since the even bit line cells 202 have a lesser number of assigned program states/bits than the odd bit line cells 203. As one of ordinary skill in the art will appreciate, the voltage margin between adjacent program states decreases as the number of assigned states increases since there is a finite programming window. As the read margin between adjacent program states decreases, the ability to accurately read the state of a target cell can decrease. This problem can be exacerbated by Vt shifts to programmed target cells due to FG-FG interference effects caused by adjacent cells programmed subsequently to the target cells being programmed to a desired state.

As illustrated in the embodiment of FIG. 2, the even bit line cells 202, which are programmed prior in time during a write operation, have a lesser number of assigned program states than the odd bit line cells 203, which are programmed after the interwoven cells 202 coupled to word line 205 during a write operation. Assigning a lesser number of program states to the even bit line cells 202 than the number of program states assigned to the adjacent odd bit line cells 203, which are subsequently programmed, can provide various benefits. As an example, the different number of program states assigned to even and odd cells can reduce adverse FG-FG interference effects associated with the alternately programmed even 202 and odd 203 bit line cells.

For instance, since the even bit line cells 202 are programmed before the odd bit line cells 203, the even bit line cells 202 are assigned a lesser number of program states which have a corresponding larger read margin RDe between adjacent states than the read margin RDo corresponding to the odd bit line cells 203. Since the read margin RDe associated with the even bit line cells 202 is larger than the read margin RDo associated with the odd bit line cells 203, the even bit line cells 202 are less susceptible to erroneous data reads due to Vt shifts associated with FG-FG interference from the subsequently programmed adjacent odd bit line cells 203.

Since the odd bit line cells 203 are programmed after the even bit line cells 202, the odd bit line cells 203 are assigned a greater number of program states which have a corresponding smaller read margin RDo between adjacent states than the read margin RDe corresponding to the even bit line cells 202. The odd bit line cells 203 are less susceptible to FG-FG interference caused by adjacent even bit line cells 202 since the Vt levels of the even bit line cells 202 are programmed to a desired program state and are not increased by subsequent further programming.

In various embodiments of the present disclosure, data stored by adjacent bit line cells 202 and 203 can be combined in response to a data retrieval request received from a processor or external host associated with the array of non-volatile memory cells. For instance, in the embodiment illustrated in FIG. 2, data stored by a cell 202 having a 1.5 bits/cell bit assignment can be combined with data stored by an adjacent cell 203 having a 2.5 bits/cell bit assignment such that the combined adjacent cells 202 and 203 represent 4 total logical bits, e.g., 1.5+2.5 bits.

For example, in the embodiment illustrated in FIG. 2, a pair of adjacent cells e.g., a 1.5 bit cell 202 having three assigned program states and a 2.5 bit cell 203 having six assigned program states, can be mapped to four binary bits. In such embodiments, an adjacent three-state cell 202 and six-state cell 203 have eighteen possible combined states, e.g., the combined cells 202 and 203 can be mapped to sixteen data states representing four binary bits and two extra states.

In some embodiments, the even and odd bit lines can be sensed together to retrieve data from a selected word line, e.g., 205. In such embodiments, the cells 202 coupled to bit lines 232-1, 232-2, ..., 232-N and the cells 203 coupled to bit lines 233-1, 233-2, ..., 233-N can represent two logical pages of data associated with the selected word line 205. As one of ordinary skill in the art will appreciate, a logical page associated with a particular word line can include a number of logical sectors each representing 512 bytes of data, for example. Embodiments are not limited to a particular logical page size, logical sector size, or to a particular number of logical pages and/or sectors associated with a particular word line, e.g., word line 205.

Figure 3:
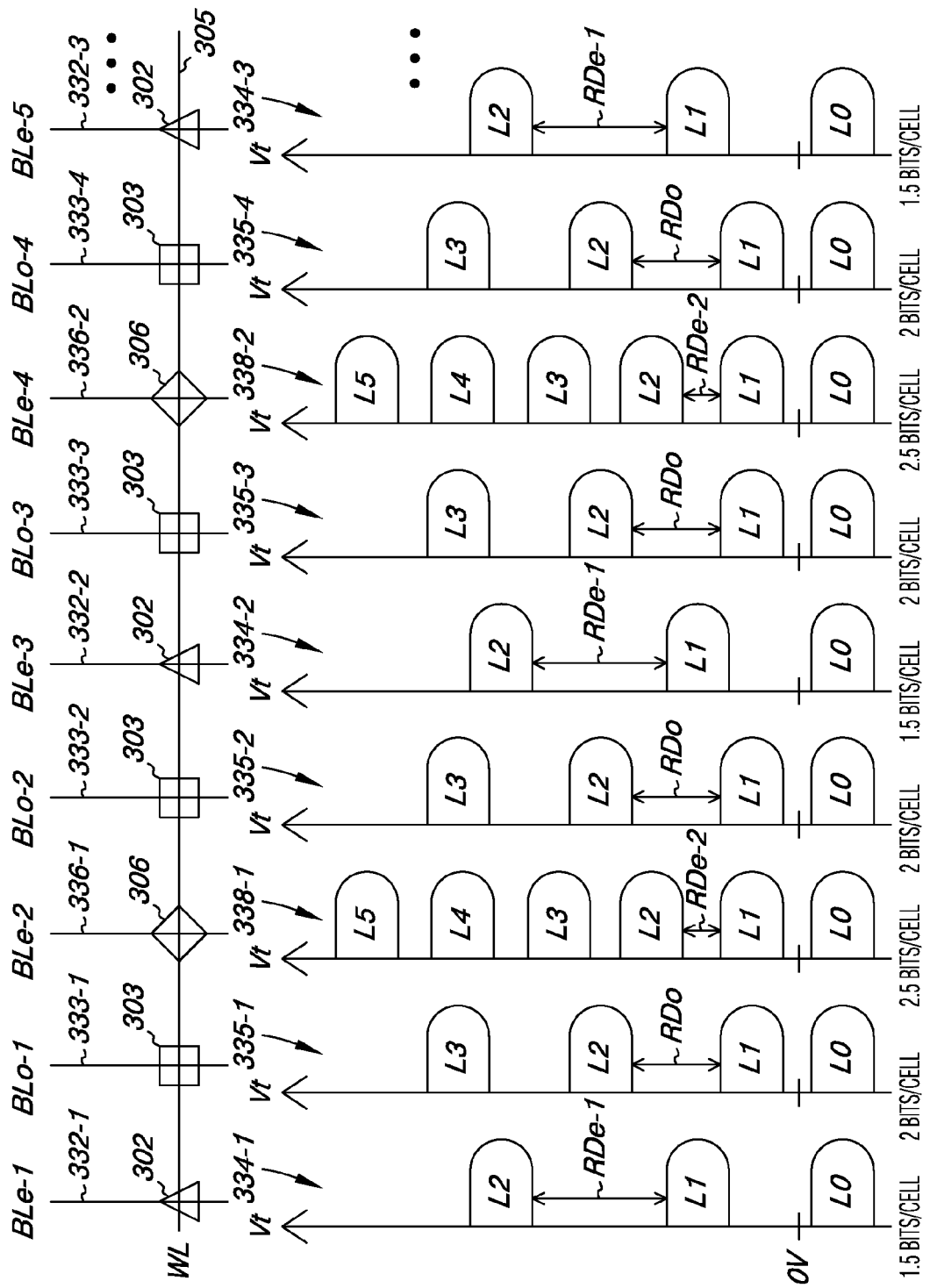
FIG. 3 illustrates threshold voltage distribution images associated with cells having different bit assignments in accordance with an embodiment of the present disclosure.

FIG. 3 illustrates threshold voltage distribution images associated with cells having different bit assignments in accordance with an embodiment of the present disclosure. The embodiment shown in FIG. 3 illustrates a number of cells 302/303/306 coupled to a word line (WL) 305. As shown in FIG. 3, the cells 302 are coupled to a first subset of even numbered bit lines 332-1 (BLe-1), 332-2 (BLe-3), and 332-3 (BLe-5). The cells 306 are coupled to a second subset of even numbered bit lines 336-1 (BLe-2) and 336-2 (BLe-4). The cells 303 are coupled to odd numbered bit lines 333-1 (BLo-1), 333-2 (BLo-2), 333-3 (BLo-3), and 333-4 (BLo-4). The pattern of cells 302/303/306 coupled to word line 305 continues on a bit line by bit line basis with a cell 303 coupled between an adjacent cell 302 and an adjacent cell 306. That is, the odd bit line cells 303 are interwoven among adjacent alternating even bit line cells 302 and 306 along word line 305.

As the reader will appreciate, the bit lines can be coupled to sensing circuitry (not shown) that can be used to determine the Vt level of cells 302/303/306 during operation. Although only one word line 305 is illustrated in the embodiment of FIG. 3, embodiments can include any number of word lines, e.g., word lines 105-1 to 105-N shown in FIG. 1.

In the embodiment of FIG. 3, the first subset of even bit line cells 302 are programmed together as a group, the second subset of even bit line cells 306 are programmed together as a group, and the odd bit line cells 303 are programmed together as a group. In various embodiments, the odd bit line cells 303 are read together as a group and correspond to an odd page of data associated with word line 305, while the even bit line cells 302 and 306 are read together and combined to correspond to an even page of data associated with word line 305.

The embodiment of FIG. 3 illustrates a number of threshold voltage (Vt) distribution images 334-1, 334-2, and 334-3 which correspond to cells 302 coupled to respective even bit lines 332-1, 332-2, and 332-3. The Vt distribution images 338-1 and 338-2 correspond to cells 306 coupled to respective even bit lines 336-1 and 336-2. The Vt distribution images 335-1, 335-2, 335-3, and 335-4 correspond to cells 303 coupled to respective odd bit lines 333-1, 333-2, 333-3, and 333-4. The even bit line Vt distribution images 334-1, 334-2, and 334-3 correspond to cells 302 having three assigned program states, e.g., Vt distributions L0, L1, and L2 as shown. The even bit line Vt distribution images 338-1 and 338-2 correspond to cells 306 having six assigned program states, e.g., Vt distributions L0, L1, L2, L3, L4, and L5 as shown. The odd bit line Vt distribution images 335-1, 335-2, 335-3, and 335-4 correspond to odd bit line cells 303 having four assigned program states, e.g., Vt distributions L0, L1, L2, and L3 as shown.

That is, in the embodiment illustrated in FIG. 3, the even bit line cells 302 can be programmed such that the Vt of the cell 302 is within one of the three assigned Vt distributions L0, L1, and L2 associated with the distribution images 334-1, 334-2, and 334-3. Similarly, the even bit line cells 306 can be programmed such that the Vt of the cell 306 is within one of the six assigned Vt distributions L0, L1, L2, L3, L4, and L5 associated with the distribution images 338-1 and 338-2. The odd bit line cells 303 can be programmed such that the Vt of the cell 303 is within one of the four assigned Vt distributions L0, L1, L2, and L3 associated with the distribution images 335-1, 335-2, 335-3, and 335-4. The L0 state can be referred to as an erase state or as a lowermost program state. In operation, memory cells 302, 303, and 306 can be placed in the L0 erase state prior to being programmed to one of their respective assigned states via a write operation.

During operation, the cells 302/303/306 coupled to a selected word line 305 are written to according to a programming sequence that includes programming the first subset of even bit line cells 302 prior to programming the second subset of even bit line cells 306 and prior to programming the interwoven odd bit line cells 303. The programming sequence associated with the embodiment illustrated in FIG. 3 includes programming the odd bit line cells 303 prior to programming the second subset of even bit line cells 306. As an example, during an operation in which data is written to the cells of word line 305, a first half of the even bit line cells, e.g., cells 302 coupled to even bit lines 332-1, 332-2, and 332-3, are programmed to one of the three program states shown in respective Vt distribution images 334-1, 334-2, and 334-3. Subsequently, the cells 303 coupled to the odd bit lines, e.g., 333-1, 333-2, 333-3, and 333-4, are programmed to one of the four program states shown in respective Vt distribution images 335-1, 335-2, 335-3, and 335-4. Subsequently, the second half of the even bit line cells, e.g., cells 306 coupled to even bit lines 336-1 and 336-2, are programmed to one of the six program states shown in respective Vt distribution images 338-1 and 338-2.

As shown in FIG. 3, the Vt distribution images 334-1, 334-2, and 334-3 correspond to even bit line cells 302 representing 1.5 bits/cell, the Vt distribution images 338-1 and 338-2 correspond to even bit line cells 306 representing 2.5 bits/cell, and the Vt distribution images 335-1, 335-2, 335-3, and 335-4 correspond to cells 303 representing 2 bits/cell. That is, the assigned number of states to which a given memory cell 302/303/306 can be programmed corresponds to an assigned number of binary bits storable by the given cell. In the embodiment shown in FIG. 3, the even bit line cells 302 and 306 have a non-integer bit assignment, e.g., 1.5 bits/cell and 2.5 bits/cell, respectively, while the odd bit line cells 303 have an integer bit assignment, e.g., 2 bits/cell. In some embodiments, the bit assignment for adjacent even bit line cells, e.g., an even bit line cell 302 and a cell 306 coupled to a next adjacent even bit line, sum to a bit assignment that is twice the bit assignment for an odd bit line cell 303. For example, in the embodiment illustrated in FIG. 3, the bit assignments for an even bit line cell 302, e.g., 1.5 bits/cell, and an even bit line cell 306, e.g., 2.5 bits/cell, sum to 4 bits/cell, which is twice the bit assignment for an odd bit line cell 303, e.g., 2 bits/cell. Embodiments are not limited to the example shown in FIG. 3.

In various prior programming sequences, all odd bit line cells are programmed together as a group and all of the even bit line cells are programmed together as a group. In such prior approaches, the even bit line cells are assigned the same number of program states as the odd bit line cells, e.g., the even and odd bit line cells have the same bit assignment per cell. In contrast, in various embodiments of the present disclosure, a number of subsets of cells coupled to even and/or odd bit lines along a given word line can be separately programmed at different times. For example, as described in connection with the embodiment of FIG. 3, a first subset of even bit line cells, e.g., 302, are programmed together prior to programming of a second subset of even bit line cells, e.g., 306. In the embodiment of FIG. 3, the even bit line cells 302 represent cells coupled to half of the even bit lines, e.g., BLe-1, BLe-3, BLe-5, etc., associated with a given word line, and the even bit line cells 306 represent cells coupled to the other half of the even bit lines, e.g., BLe-2, Ble-4, etc., associated with the given word line, e.g., 305. Embodiments are not limited to programming sequences in which the cells of a given word line are divided into any particular number of subsets. For example, in some embodiments the even bit line cells and/or the odd bit line cells can be divided into more than two subsets.

The embodiment illustrated in FIG. 3 includes read margins associated with the first subset of even bit line cells 302, the second subset of even bit line cells 306, and the odd bit line cells 303. As shown in Vt distribution images 334-1, 334-2, and 334-3, the first subset of even bit line cells 302 include an associated read margin RDe-1 between adjacent program states L1 and L2. As shown in Vt distribution images 338-1 and 338-2, the second subset of even bit line cells 306 include an associated read margin RDe-2 between adjacent program states L1 and L2. As shown in Vt distribution images 335-1, 335-2, 335-3, and 335-4, the odd bit line cells 303 include an associated read margin RDo between adjacent program states L1 and L2.

In the embodiment illustrated in FIG. 3, read margin RDe-1 is greater than read margins RDe-2 and RDo since the first subset of even bit line cells 302 have a lesser number of assigned program states/bits than the second subset of even bit line cells 306 and the odd bit line cells 303. Similarly, the read margin RDo is greater than read margin RDe-2 since the odd bit line cells 303 have a lesser number of assigned program states/bits than the second subset of even bit line cells 306. As noted above, the voltage margin between adjacent program states decreases as the number of assigned states increases since there is a finite programming window. As the read margin between adjacent program states decreases, the ability to accurately read the state of a target cell can decrease. This problem can be exacerbated by Vt shifts to programmed target cells due to FG-FG interference effects caused by adjacent cells programmed subsequently to the target cells being programmed to a desired state.

As illustrated in the embodiment of FIG. 3, the first subset of even bit line cells 302, which are programmed first in time during a write operation, have a lesser number of assigned program states than the odd bit line cells 303 and the second subset of even bit line cells 306, which are programmed after the interwoven cells 302 coupled to word line 305 during a write operation. In the embodiment of FIG. 3, the odd bit line cells 303, which are programmed second in time during a write operation, have a lesser number of assigned program states than the second subset of even bit line cells 306, which are programmed after the interwoven cells 303 coupled to word line 305 during a write operation.

Various embodiments of the present disclosure include varying the number of program states assigned to cells coupled to a given word line, e.g., word line 305, based on a programming sequence associated with the number of cells. Varying the assigned number of program states on a bit line by bit line basis can reduce adverse FG-FG interference effects associated with programming adjacent cells along a selected word line. Such adverse FG-FG interference effects can become more problematic as adjacent floating gates become physically closer due to non-volatile memory device scaling. In embodiments in which the assigned number of program states and/or the bit assignment for cells coupled to a given word line are varied on a bit line by bit line basis, assigning a lesser number of program states and/or bits to subsets of cells of the selected word line which are to be programmed first than to subsets of cells of the selected word line which are to be subsequently programmed can provide various benefits.

For instance, in the embodiment illustrated in FIG. 3, the since the first subset of even bit line cells 302 are programmed before the odd bit line cells 303 and the second subset of even bit line cells 306, the first subset of even bit line cells 302 is assigned a lesser number of program states which have a corresponding larger read margin RDe-1 between adjacent states than the read margins RDo and RDe-2 corresponding to the respective odd bit line cells 303 and second subset of even bit line cells 306. Since the read margin RDe-1 associated with the even bit line cells 302 is larger than the read margins RDo and RDe-2 associated with the odd bit line cells 303 and the even bit line cells 306, the even bit line cells 302 are less susceptible to erroneous data reads due to Vt shifts associated with FG-FG interference from the subsequently programmed adjacent odd bit line cells 303 and/or adjacent even bit line cells 306.

In the embodiment illustrated in FIG. 3, since the odd bit line cells 303 are programmed after the even bit line cells 302, the odd bit line cells 303 are assigned a greater number of program states which have a corresponding smaller read margin RDo between adjacent states than the read margin RDe-1 corresponding to the even bit line cells 302. The odd bit line cells 303 are less susceptible to FG-FG interference caused by programming of the adjacent even bit line cells 302 since the Vt levels of the even bit line cells 302 are programmed to a desired program state, e.g., the Vats of the even bit line cells 302 are not increased via further programming after the cells 302 have reached the desired program state.

However, in the embodiment illustrated in FIG. 3, the second subset of even bit line cells 306 are programmed subsequent to the adjacent odd bit line cells being programmed to a desired program state. Since the second subset of even bit line cells 306 are programmed after the odd bit line cells 303, the even bit line cells 306 are assigned a greater number of program states which have a corresponding smaller read margin RDe-2 between adjacent states than the read margin RDo corresponding to the odd bit line cells 303. The even bit line cells 306 are less susceptible to FG-FG interference caused by programming of the adjacent odd bit line cells 303 since the Vt levels of the odd bit line cells 303 are programmed to a desired program state, e.g., the Vats of the odd bit line cells 303 are not increased via further programming after the cells 303 have reached the desired program state.

In various embodiments of the present disclosure, data stored by adjacent odd bit line cells 303 are read out together as a group and can correspond to a logical page, e.g., an odd logical page, of data associated with a given word line 305. In such embodiments, the first subset of even bit line cells 302 and the second subset of even bit line cells 306 can also be read out together as a group and can correspond to a logical page, e.g., an even logical page, of data associated with a given word line 305. In embodiments in which the first subset of even bit line cells 302 and the second subset of even bit line cells 306 are read out together, the data stored by adjacent even bit line cells, e.g., cell 302 coupled to even bit line 332-1 and cell 306 coupled to even bit line 336-1, can be combined in response to a data retrieval request received from a processor or external host associated with the array of non-volatile memory cells. For instance, in the embodiment illustrated in FIG. 3, data stored by an even bit line cell 302 having a 1.5 bits/cell bit assignment can be combined with data stored by an adjacent even bit line cell 306 having a 2.5 bits/cell bit assignment such that the combined adjacent even bit line cells 302 and 306 represent 4 total logical bits, e.g., 1.5+2.5 bits, or 2 bits/cell.

In the embodiment illustrated in FIG. 3, a pair of adjacent even bit line cells e.g., a 1.5 bit cell 302 having three assigned program states and a 2.5 bit cell 306 having six assigned program states, can be mapped to four binary bits. In such embodiments, the adjacent three-state cell 302 and six-state cell 306 have eighteen possible combined states, e.g., the combined cells 302 and 306 can be mapped to sixteen data states representing four binary bits and two extra states. In such embodiments, pairs of adjacent odd bit line cells, e.g., 2 bit cells 303 having four assigned program states, can also be mapped to four binary bits such that the logical odd page size and the logical even page size associated with a selected word line are the same.

In the embodiment illustrated in FIG. 3, the even bit lines coupled to cells 302 and the even bit lines coupled to cells 306 can be sensed together to retrieve data from a selected word line 305. The odd bit lines coupled to cells 303 can also be sensed together to retrieve data from the selected word line 305. In such embodiments, the data stored in the even bit line cells 302 and 306 of word line 305 represents a logical page of data and the data stored in the odd bit line cells 303 of word line 305 represents a different logical page of data.

Figure 4:
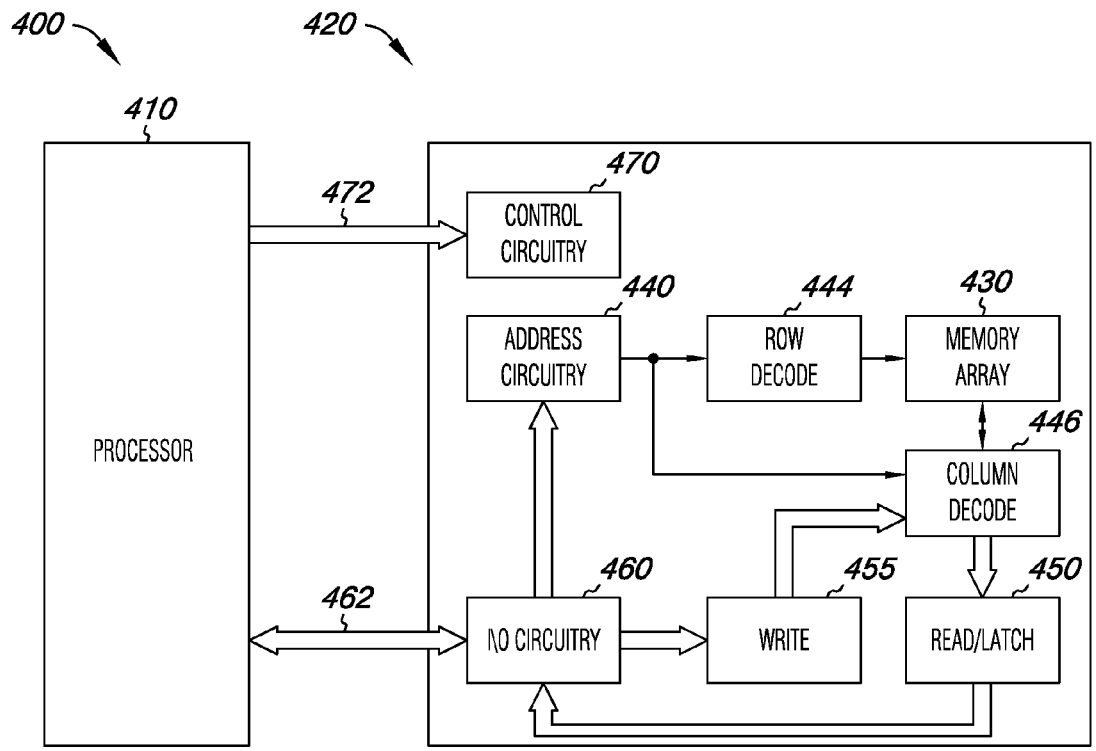
FIG. 4 is a functional block diagram of an electronic memory system having at least one memory device in accordance with an embodiment of the present disclosure.

FIG. 4 is a functional block diagram of an electronic memory system 400 having at least one memory device 420 programmed in accordance with an embodiment of the present disclosure. Memory system 400 includes a processor 410 coupled to a non-volatile memory device 420 that includes a memory array 430 of multilevel non-volatile cells. The memory system 400 can include separate integrated circuits or both the processor 410 and the memory device 420 can be on the same integrated circuit. The processor 410 can be a microprocessor or some other type of controlling circuitry such as an application-specific integrated circuit (ASIC).

For clarity, the electronic memory system 400 has been simplified to focus on features with particular relevance to the present disclosure. The memory device 420 includes an array of non-volatile memory cells 430, which can be floating gate flash memory cells with a NAND architecture. The control gates of each row of memory cells are coupled with a word line, while the drain regions of the memory cells are coupled to bit lines. The source regions of the memory cells are coupled to source lines, as the same has been illustrated in FIG. 1. As will be appreciated by those of ordinary skill in the art, the manner of connection of the memory cells to the bit lines and source lines depends on whether the array is a NAND architecture, a NOR architecture, and AND architecture, or some other memory array architecture.

The embodiment of FIG. 4 includes address circuitry 440 to latch address signals provided over I/O connections 462 through I/O circuitry 460. Address signals are received and decoded by a row decoder 444 and a column decoder 446 to access the memory array 430. In light of the present disclosure, it will be appreciated by those skilled in the art that the number of address input connections depends on the density and architecture of the memory array 430 and that the number of addresses increases with both increased numbers of memory cells and increased numbers of memory blocks and arrays.

The memory array 430 of non-volatile cells can include non-volatile multilevel memory cells having varying numbers of assigned program states and varying bit assignments according to embodiments described herein. The memory device 420 reads data in the memory array 430 by sensing voltage and/or current changes in the memory array columns using sense/buffer circuitry that in this embodiment can be read/latch circuitry 450. The read/latch circuitry 450 can read and latch a page or row of data from the memory array 430. I/O circuitry 460 is included for bi-directional data communication over the I/O connections 462 with the processor 410. Write circuitry 455 is included to write data to the memory array 430.

Control circuitry 470 decodes signals provided by control connections 472 from the processor 410. These signals can include chip signals, write enable signals, and address latch signals that are used to control the operations on the memory array 430, including data read, data write, and data erase operations. In various embodiments, the control circuitry 470 is responsible for executing instructions from the processor 410 to perform the operating and programming according to embodiments of the present disclosure. The control circuitry 470 can be a state machine, a sequencer, or some other type of controller. It will be appreciated by those skilled in the art that additional circuitry and control signals can be provided, and that the memory device detail of FIG. 4 has been reduced to facilitate ease of illustration.

Figure 5:
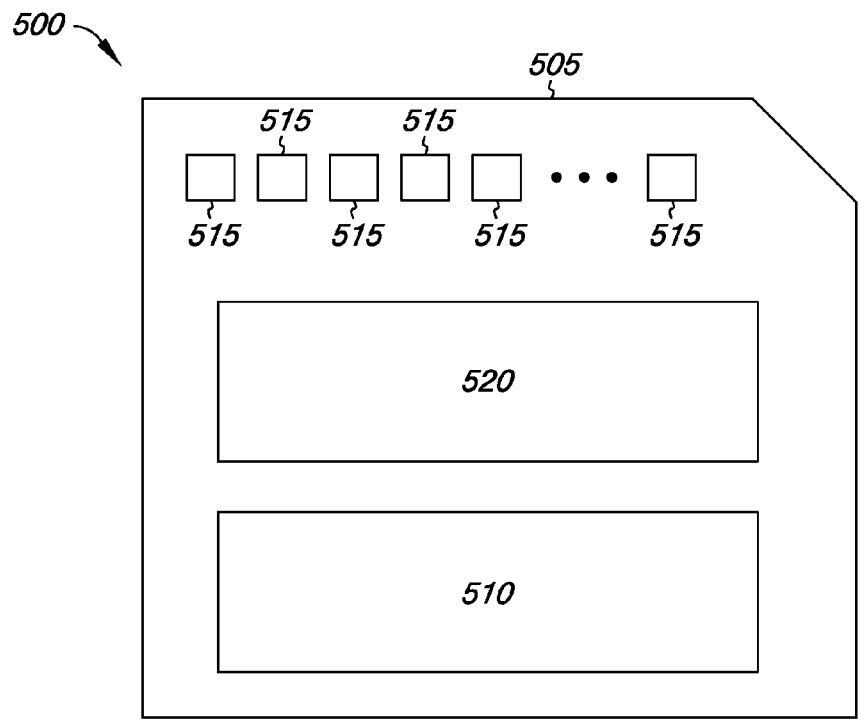
FIG. 5 is a functional block diagram of a memory module having at least one memory device in accordance with an embodiment of the present disclosure.

FIG. 5 is a functional block diagram of a memory module having at least one memory device programmed in accordance with an embodiment of the present disclosure. Memory module 500 is illustrated as a memory card, although the concepts discussed with reference to memory module 500 are applicable to other types of removable or portable memory (e.g., USB flash drives) and are intended to be within the scope of "memory module" as used herein. In addition, although one example form factor is depicted in FIG. 5, these concepts are applicable to other form factors as well.

In some embodiments, memory module 500 will include a housing 505 (as depicted) to enclose one or more memory devices 510, though such a housing is not essential to all devices or device applications. At least one memory device 510 includes an array of non-volatile multilevel memory cells that can be read according to embodiments described herein. Where present, the housing 505 includes one or more contacts 515 for communication with a host device. Examples of host devices include digital cameras, digital recording and playback devices, PDAs, personal computers, memory card readers, interface hubs and the like. For some embodiments, the contacts 515 are in the form of a standardized interface. For example, with a USB flash drive, the contacts 515 might be in the form of a USB Type-A male connector. For some embodiments, the contacts 515 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 515 provide an interface for passing control, address and/or data signals between the memory module 500 and a host having compatible receptors for the contacts 515.

The memory module 500 may optionally include additional circuitry 520, which may be one or more integrated circuits and/or discrete components. For some embodiments, the additional circuitry 520 may include a memory controller, e.g., control circuitry, for controlling access across multiple memory devices 510 and/or for providing a translation layer between an external host and a memory device 510. For example, there may not be a one-to-one correspondence between the number of contacts 515 and a number of 510 connections to the one or more memory devices 510. Thus, a memory controller could selectively couple an I/O connection (not shown in FIG. 5) of a memory device 510 to receive the appropriate signal at the appropriate I/O connection at the appropriate time or to provide the appropriate signal at the appropriate contact 515 at the appropriate time. Similarly, the communication protocol between a host and the memory module 500 may be different than what is required for access of a memory device 510. A memory controller could then translate the command sequences received from a host into the appropriate command sequences to achieve the desired access to the memory device 510. Such translation may further include changes in signal voltage levels in addition to command sequences.

The additional circuitry 520 may further include functionality unrelated to control of a memory device 510 such as logic functions as might be performed by an ASIC. Also, the additional circuitry 520 may include circuitry to restrict read or write access to the memory module 500, such as password protection, biometrics or the like. The additional circuitry 520 may include circuitry to indicate a status of the memory module 500. For example, the additional circuitry 520 may include functionality to determine whether power is being supplied to the memory module 500 and whether the memory module 500 is currently being accessed, and to display an indication of its status, such as a solid light while powered and a flashing light while being accessed. The additional circuitry 520 may further include passive devices, such as decoupling capacitors to help regulate power requirements within the memory module 500.

CONCLUSION

Methods, devices, modules, and systems for operating non-volatile memory cells have been shown. One method embodiment includes assigning, to a first cell coupled to a word line, a first number of program states to which the first cell can be programmed. The method includes assigning, to a second cell coupled to the word line, a second number of program states to which the second cell can be programmed, wherein the second number of program states is greater than the first number of program states. The method includes programming the first cell to one of the first number of program states prior to programming the second cell to one of the second number of program states.

In some embodiments, a third cell coupled to the word line is assigned a third number of program states to which the third cell can be programmed. In such embodiments, the third number of program states is greater than the second number of program states and the third cell is programmed after the first and second cell. The number of program states assigned to the number of cells and/or the bit assignments of the cells can be based on a programming sequence associated with the number of cells.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for operating an array of non-volatile multi-level memory cells, the method comprising:
    assigning, to a first cell coupled to a row select line, a first number of program states to which the first cell is to be programmed;
    assigning, to a second cell coupled to the row select line, a second number of program states to which the second cell is to be programmed, wherein the second number of program states is greater than the first number of program states;
    assigning, to a third cell coupled to the row select line, a third number of program states to which the third cell is to be programmed, wherein the third number of program states is different than the first number of program states and the second number of program states;
    wherein the assigning includes assigning to at least one of the first cell, the second cell, and the third cell, a number of program states that corresponds to a non-integer bit assignment for the cell; and
    programming the first cell to one of the first number of program states prior to programming the second cell to one of the second number of program states.

2. The method of claim 1, wherein the assigning includes assigning, to each of the first cell and the second cell, a number of program states that corresponds to a non-integer bit assignment for the cell.

3. The method of claim 2, wherein the method includes combining data stored by the first programmed cell with data stored by the second programmed cell in response to a data retrieval request.

4. A method for operating an array of non-volatile multi-level memory cells, the method comprising:
    assigning, to a first cell coupled to a row select line, a first number of program states to which the first cell is to be programmed;

assigning, to a second cell coupled to the row select line, a second number of program states to which the second cell is to be programmed, wherein the second number of program states is greater than the first number of program states;

assigning, to a third cell coupled to the row select line, a third number of program states to which the third cell is to be programmed, wherein the third number of program states is greater than the second number of program states; and programming the first cell to one of the first number of program states prior to programming the second cell to one of the second number of program states and prior to programming the third cell to one of the third number of program states;

wherein the assigning includes assigning to at least one of the first cell, the second cell, and the third cell, a number of program states that corresponds to a non-integer bit assignment for the cell.

5. The method of claim 4, wherein the method includes:

assigning, to the first cell, a number of program states that corresponds to a non-integer bit assignment for the first cell; and assigning, to the third cell, a number of program states that corresponds to a non-integer bit assignment for the third cell.

6. The method of claim 5, wherein the method includes assigning the number of program states to the first and third cell such that the non-integer bit assignments for the first and third cell sum to a bit assignment twice that of the second cell.

7. The method of claim 6, wherein the second cell is coupled to the row select line between the first cell and the third cell, and wherein the method includes reading the first programmed cell and the third programmed cell together.

8. The method of claim 7, wherein the method includes combining data read from the first programmed cell with data read from the third programmed cell, the read data corresponding to a logical page of data.

9. A method for operating an array of non-volatile multi-level memory cells, the method comprising:

assigning, for a number of cells coupled to a first row select line, a number of program states to which the cells are to be programmed; and varying the number of program states assigned to the number of cells based on a programming sequence associated with the number of cells;

wherein the programming sequence includes programming a first subset of the number of cells before programming a second subset of the number of cells, and wherein varying the number of program states assigned includes:

assigning a first number of program states to the first subset; and assigning a second number of program states to the second subset, the second number being greater than the first number of program states;

wherein the programming sequence includes programming a third subset of the number of cells after programming the second subset of the number of cells, and wherein varying the number of program states assigned includes assigning a third number of program states to the third subset, the third number being greater than the second number of program states; and wherein assigning at least one of the first number, the second number, and the third number includes assigning a number of program states which corresponds to a non-integer bit assignment.

10. The method of claim 9, wherein:

assigning the first number of program states includes assigning a number of program states which corresponds to a non-integer bit assignment for the first subset, wherein the first subset of cells are coupled to even numbered sense lines; and assigning the second number of program states includes assigning a number of program states which corresponds to a non-integer bit assignment for the second subset wherein the non-integer bit assignment for the second subset is greater than the bit assignment for the second subset and the second subset of cells are coupled to odd numbered sense lines.

11. The method of claim 9, wherein:

programming the first subset includes programming a subset coupled to a number of even numbered sense lines;

programming the second subset includes programming a subset coupled to a number of odd numbered sense lines; and programming the third subset includes programming a subset coupled to a number of even numbered sense lines different from the first number of even numbered sense lines.

12. The method of claim 11, wherein:

assigning the first number of program states includes assigning a number of program states which corresponds to a non-integer bit assignment for the first subset; and assigning the third number of program states includes assigning a number of program states which corresponds to a non-integer bit assignment for the third subset.

13. A non-volatile memory device comprising:

an array of non-volatile memory cells arranged in rows coupled by row select lines and columns coupled by sense lines; and control circuitry coupled to the array and configured to program cells coupled to a selected row select line according to a programming sequence performed on a sense line by sense line basis, wherein:

cells coupled to the selected row select line and associated with a number of sense lines to be programmed first have a first assigned number of program states; and cells coupled to the selected row select line and associated with a number of sense lines to be programmed second have a second assigned number of program states, the second assigned number is greater than the first assigned number;

wherein the array includes cells coupled to the selected row select line that are to be programmed to a third assigned number of program states; and wherein at least one of the first assigned number of program states, the second assigned number of program states, and the second number of program states corresponds to a non-integer bit assignment.

14. The device of claim 13, wherein the number of sense lines to be programmed first correspond to even numbered sense lines and the number of sense lines to be programmed second correspond to odd numbered sense lines.

15. The device of claim 13, wherein the first assigned number of program states corresponds to a first non-integer bit assignment for the cells associated with the number of sense lines to be programmed first and the second assigned number of program states corresponds to a second non-integer bit assignment for the cells associated with the number of sense lines to be programmed second.

16. The device of claim 15, wherein the first non-integer bit assignment is at least 2.5 bits per cell and the second non-integer bit assignment is at least 3.5 bits per cell.

17. A non-volatile memory device comprising:

an array of non-volatile memory cells arranged in rows coupled by row select lines and columns coupled by sense lines; and control circuitry coupled to the array and configured to program cells coupled to a selected row select line according to a programming sequence performed on a sense line by sense line basis, wherein:

cells coupled to the selected row select line and associated with a number of sense lines to be programmed first have a first assigned number of program states;

cells coupled to the selected row select line and associated with a number of sense lines to be programmed second have a second assigned number of program states, the second assigned number is greater than the first assigned number; and cells coupled to the selected row select line and associated with a number of sense lines to be programmed third have a third assigned number of program states, the third assigned number is greater than the second assigned number; and wherein at least one of the first assigned number of program states, the second assigned number of program states, and the third number of assigned program states corresponds to a non-integer bit assignment.

18. The device of claim 17, wherein the number of sense lines to be programmed first correspond to a first subset of even numbered sense lines and the number of sense lines to be programmed third correspond to a second subset of even numbered sense lines.

19. The device of claim 17, wherein the first assigned number of program states corresponds to a non-integer bit assignment for the cells associated with the number of sense lines to be programmed first and the third assigned number of program states corresponds to a different non-integer bit assignment for the cells associated with the number of sense lines to be programmed third.

20. The device of claim 19, wherein the second assigned number of program states corresponds to an integer bit assignment for cells associated with the number of sense lines to be programmed second.

21. The device of claim 17, wherein the control circuitry is configured to program cells coupled to a next subsequent selected row select line according to the programming sequence performed on the sense line by sense line basis.

* * * * *

UNITED STATES PATENT AND TRADEMARK OFFICE
CERTIFICATE OF CORRECTION

PATENT NO. : 7,742,335 B2
APPLICATION NO. : 11/931912
DATED : June 22, 2010
INVENTOR(S) : Seiichi Aritome It is certified that error appears in the above-identified patent and that said Letters Patent is hereby corrected as shown below:

In column 16, line 10, in Claim 10, delete "subset" and insert -- subset, --, therefor.

Signed and Sealed this

Twenty-fourth Day of August, 2010

David J. Kappos
*Director of the United States Patent and Trademark Office*